United States Patent
Kim et al.

(10) Patent No.: US 12,243,812 B2
(45) Date of Patent: *Mar. 4, 2025

(54) ALTERNATIVE SURFACES FOR CONDUCTIVE PAD LAYERS OF SILICON BRIDGES FOR SEMICONDUCTOR PACKAGES

(71) Applicant: Intel Corporation, Santa Clara, CA (US)

(72) Inventors: Dae-Woo Kim, Phoenix, AZ (US); Sujit Sharan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/386,913

(22) Filed: Nov. 3, 2023

(65) Prior Publication Data

US 2024/0071884 A1    Feb. 29, 2024

Related U.S. Application Data

(60) Division of application No. 16/219,765, filed on Dec. 13, 2018, now Pat. No. 11,848,259, which is a
(Continued)

(51) Int. Cl.
*H01L 23/538* (2006.01)
*H01L 23/00* (2006.01)
(Continued)

(52) U.S. Cl.
CPC ........ *H01L 23/49827* (2013.01); *H01L 23/13* (2013.01); *H01L 23/49822* (2013.01);
(Continued)

(58) Field of Classification Search
CPC ....... H01L 2924/153; H01L 2924/1517; H01L 2224/16225; H01L 2224/14; H01L 23/48
See application file for complete search history.

(56) References Cited

U.S. PATENT DOCUMENTS 9,559,005 B2    1/2017   Tsai
10,134,706 B2   11/2018  Pan
(Continued)

FOREIGN PATENT DOCUMENTS

| TW | 201419485 | 5/2014 |
| TW | 201533862 | 9/2015 |
| TW | 201539678 | 10/2015 |

OTHER PUBLICATIONS

International Search Report and Written Opinion for International Patent Application No. PCT/US2015/058069 mailed Jun. 30, 2016, 8 pgs.
(Continued)

*Primary Examiner* — Walter H Swanson
(74) *Attorney, Agent, or Firm* — Schwabe, Williamson & Wyatt, P.C.

(57) ABSTRACT

Alternative surfaces for conductive pad layers of silicon bridges for semiconductor packages, and the resulting silicon bridges and semiconductor packages, are described. In an example, a semiconductor structure includes a substrate having a lower insulating layer disposed thereon. The substrate has a perimeter. A metallization structure is disposed on the lower insulating layer. The metallization structure includes conductive routing disposed in a dielectric material stack. First and second pluralities of conductive pads are disposed in a plane above the metallization structure. Conductive routing of the metallization structure electrically connects the first plurality of conductive pads with the second plurality of conductive pads. An upper insulating
(Continued)

layer is disposed on the first and second pluralities of conductive pads. The upper insulating layer has a perimeter substantially the same as the perimeter of the substrate.

16 Claims, 7 Drawing Sheets

Related U.S. Application Data continuation of application No. 15/749,462, filed as application No. PCT/US2015/058069 on Oct. 29, 2015, now Pat. No. 10,177,083.

(51) Int. Cl.
  *H01L 23/13* (2006.01)
  *H01L 23/498* (2006.01)
  *H01L 25/065* (2023.01)
  *H01L 23/48* (2006.01)

(52) U.S. Cl.
  CPC .......... *H01L 23/5381* (2013.01); *H01L 24/00* (2013.01); *H01L 25/0655* (2013.01); *H01L 23/48* (2013.01); *H01L 24/16* (2013.01); *H01L 24/17* (2013.01); *H01L 2224/14* (2013.01); *H01L 2224/16225* (2013.01); *H01L 2224/16238* (2013.01); *H01L 2224/1703* (2013.01); *H01L 2224/171* (2013.01); *H01L 2224/17133* (2013.01); *H01L 2224/17177* (2013.01); *H01L 2924/1431* (2013.01); *H01L 2924/1435* (2013.01); *H01L 2924/1517* (2013.01); *H01L 2924/153* (2013.01)

(56) References Cited

U.S. PATENT DOCUMENTS

| | | | |
|---|---|---|---|
| 10,269,673 | B2 | 4/2019 | Yu |
| 2012/0147578 | A1 | 6/2012 | Jin et al. |
| 2014/0042612 | A1 | 2/2014 | Liu et al. |
| 2014/0097861 | A1 | 4/2014 | Okutsu |
| 2014/0174807 | A1 | 6/2014 | Roy et al. |
| 2014/0252599 | A1 | 9/2014 | Kwon et al. |
| 2014/0264791 | A1 | 9/2014 | Manusharow et al. |
| 2015/0091179 | A1 | 4/2015 | Shenoy |
| 2015/0171015 | A1* | 6/2015 | Mahajan ............ H01L 23/3114 257/774 |
| 2015/0200179 | A1 | 7/2015 | Do et al. |
| 2015/0279817 | A1 | 10/2015 | Zhang |
| 2015/0364422 | A1 | 12/2015 | Zhai et al. |
| 2015/0371951 | A1 | 12/2015 | Yeh et al. |
| 2016/0093597 | A1 | 3/2016 | Chang et al. |
| 2016/0133571 | A1 | 5/2016 | Lee et al. |
| 2016/0249457 | A1 | 8/2016 | Min et al. |
| 2016/0329284 | A1 | 11/2016 | We et al. |

OTHER PUBLICATIONS

International Preliminary Report on Patentability for International Patent Application No. PCT/US2015/058069 mailed May 11, 2018, 7 pages.

Notice of Allowance from Taiwan Patent Application No. 105126483, mailed Dec. 18, 2019, 4 pgs.

* cited by examiner

ALTERNATIVE SURFACES FOR CONDUCTIVE PAD LAYERS OF SILICON BRIDGES FOR SEMICONDUCTOR PACKAGES

CROSS-REFERENCE TO RELATED APPLICATION

This patent application is a divisional of U.S. patent application Ser. No. 16/219,765, filed Dec. 13, 2018, which is a continuation of U.S. patent application Ser. No. 15/749,462, filed Jan. 31, 2018, now U.S. Pat. No. 10,177,083, issued Jan. 8, 2019, which is a U.S. National Phase application under 35 U.S.C. § 371 of International Application No. PCT/US2015/058069, filed Oct. 29, 2015, entitled "ALTERNATIVE SURFACES FOR CONDUCTIVE PAD LAYERS OF SILICON BRIDGES FOR SEMICONDUCTOR PACKAGES," which designates the United States of America, the entire disclosure of which are hereby incorporated by reference in their entirety and for all purposes.

TECHNICAL FIELD

Embodiments of the invention are in the field of semiconductor packages and, in particular, alternative surfaces for conductive pad layers of silicon bridges for semiconductor packages and the resulting silicon bridges and semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

Newer packaging and die-to-die interconnect approaches, such as through silicon via (TSV), silicon interposers and silicon bridges, are gaining much attention from designers for the realization of high performance Multi-Chip Module (MCM) and System in Package (SiP). However, additional improvements are needed for such newer packaging regimes.

DESCRIPTION OF THE EMBODIMENTS

Figure 1:
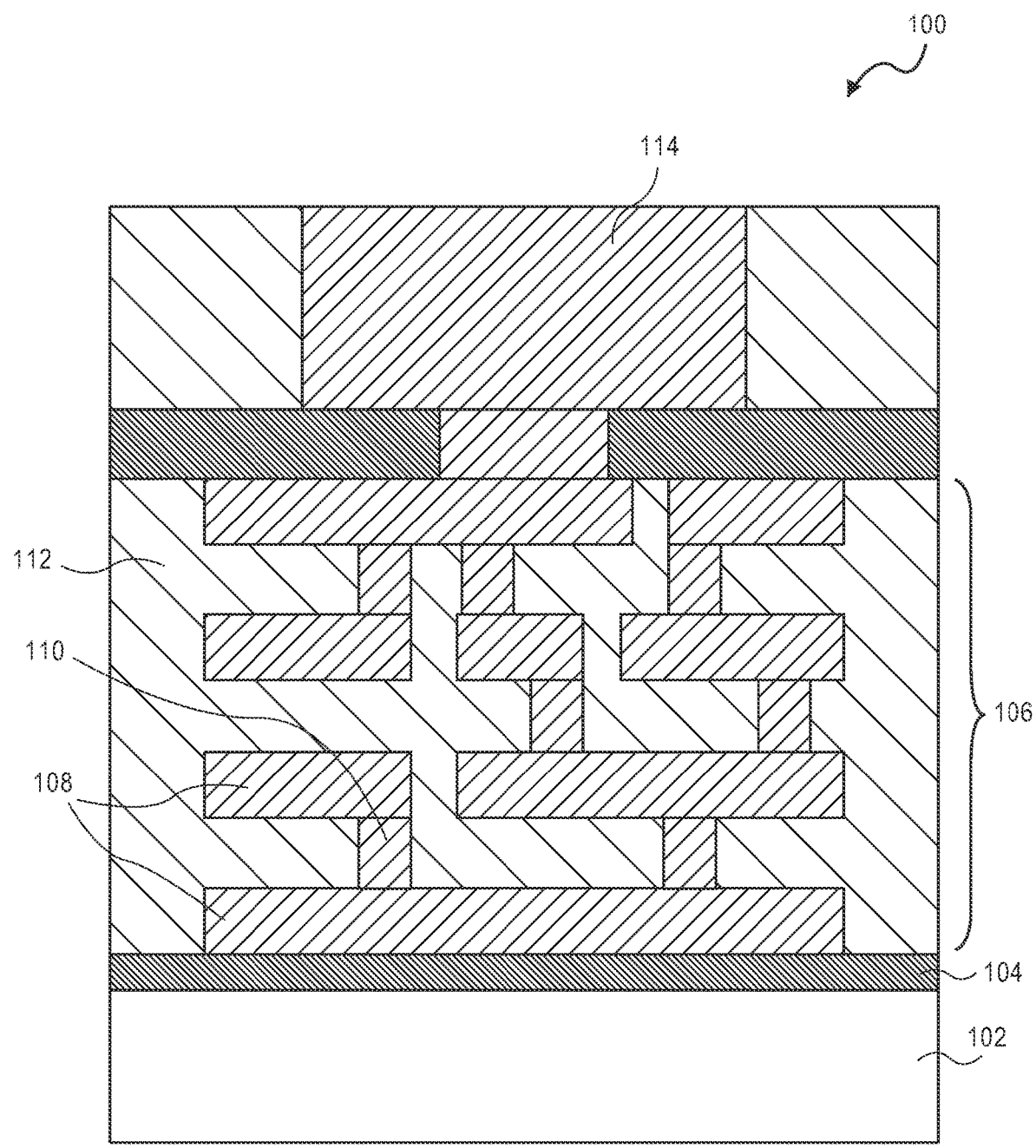
FIG. 1 is a cross-sectional view of a state-of-the-art silicon bridge having a relatively thick copper pad structure.

Alternative surfaces for conductive pad layers of silicon bridges for semiconductor packages, and the resulting silicon bridges and semiconductor packages, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific product configurations, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to alternative surfaces for conductive pad layers, such as copper pad layers, for silicon (Si) bridges. Applications may be particularly useful for so-called 2.5 D packaging designs. As used throughout the term "silicon bridge" is used to refer to a die providing routing for two or more device dies. The term "Embedded Multi-die Interconnect Bridge (EMIB)" refers to the inclusion of such a silicon bridge die in a package substrate, or the resulting package.

To provide context, state-of-the-art embedded silicon bridge technology typically employs between 5-6 microns of copper for a pad layer for package via landing. For example, approximately 3-4 microns of copper may be etched away during a silicon bridge embedding process. However, a 5-6 microns of copper structure requires more than approximately 3-fold increase of a typical fab copper plating process. Additionally, long lead times for Chemical Mechanical Polishing (CMP) are typically required. Such an ultra-thick copper layer may also induce wafer bow issues, impacting on assembly processes such as wafer thinning/singulation/tape and reel etc.

Addressing one or more of the above issues, in accordance with an embodiment of the present invention, an insulating protecting layer, such as a silicon nitride layer, is incorporated on the top surface of a relatively thinner copper pad. Such an insulating protecting layer may be included in embedded silicon bridge structures, as described in greater detail below. The resulting structure, having a relatively thinner pad thickness, can be implemented to eliminate thick copper pad processing which may lead to improved throughput time (TPT) and wafer bowing mitigation or elimination.

In more specific embodiments, a silicon nitride layer is deposited on the top surface of a thin copper pad layer, e.g., having a thickness of approximately 2 microns or less. The silicon nitride layer protects the underlying copper pad layer during assembly processing such that, in one embodiment, the need to etch a copper pad layer during a silicon bridge embedding process may be eliminated. In one embodiment, the silicon nitride layer formed one the copper pad can be used to enhance package layer (e.g., an ABF layer) to silicon bridge adhesion, aiding in resolving a known reliability problem.

Overall, it is to be appreciated that the process of depositing a silicon nitride layer on an entire wafer is more straightforward and efficient than forming 5-6 micron thick copper pad layers. Instead of using such a thick copper pad layer, in an embodiment, reducing the copper pad layer to approximately 2 microns results in a coper pad fabrication much more similar to other metal layer fabrication processes which are already well-established in the fab environment. Such standard processing is used to fabricate a relatively thinner copper pad (e.g., 2 microns instead of 5-6 microns), and is followed by deposition of a silicon nitride layer having a thickness of approximately 0.1 microns for copper pad protection. The resulting "thin copper pad"-based silicon bridge can be embedded in a package following wafer thinning and singulation. In a particular embodiment, during a silicon bridge embedding process, the thin silicon nitride layer is removed in some regions be removed by a packaging via laser drill process to expose a clean copper pad surface for package via copper plating. In such a process, the freshly exposed copper pad layer has a sufficiently clean surface such that additional etch processes typically employed for package via adhesion can be eliminated. Additionally, it is to be appreciated that, in an embodiment, the silicon nitride layer is removed only in the package via landing area, and the remainder of the silicon nitride layer is retained to protect the silicon bridge.

In order to exemplify the concepts described herein, FIG. 1 is a cross-sectional view of a state-of-the-art silicon bridge having a relatively thick copper pad structure.

Referring to FIG. 1, a silicon bridge includes a silicon substrate 102 having a silicon nitride layer 104 disposed thereon. A metallization structure 106 is disposed on the silicon nitride layer 104. The metallization structure 106 includes copper lines 108 and vias 110 disposed in a dielectric material stack 112. A copper pad 114 is disposed above the metallization structure 106. The copper pad has a thickness of approximately 5-6 microns.

In contrast to FIG. 1, a thin conductive pad layer may be used together with an overlying protecting insulating layer. For example, FIG. 2 is a cross-sectional view of a silicon bridge having a relatively thin conductive pad structure, in accordance with an embodiment of the present invention.

Figure 2:
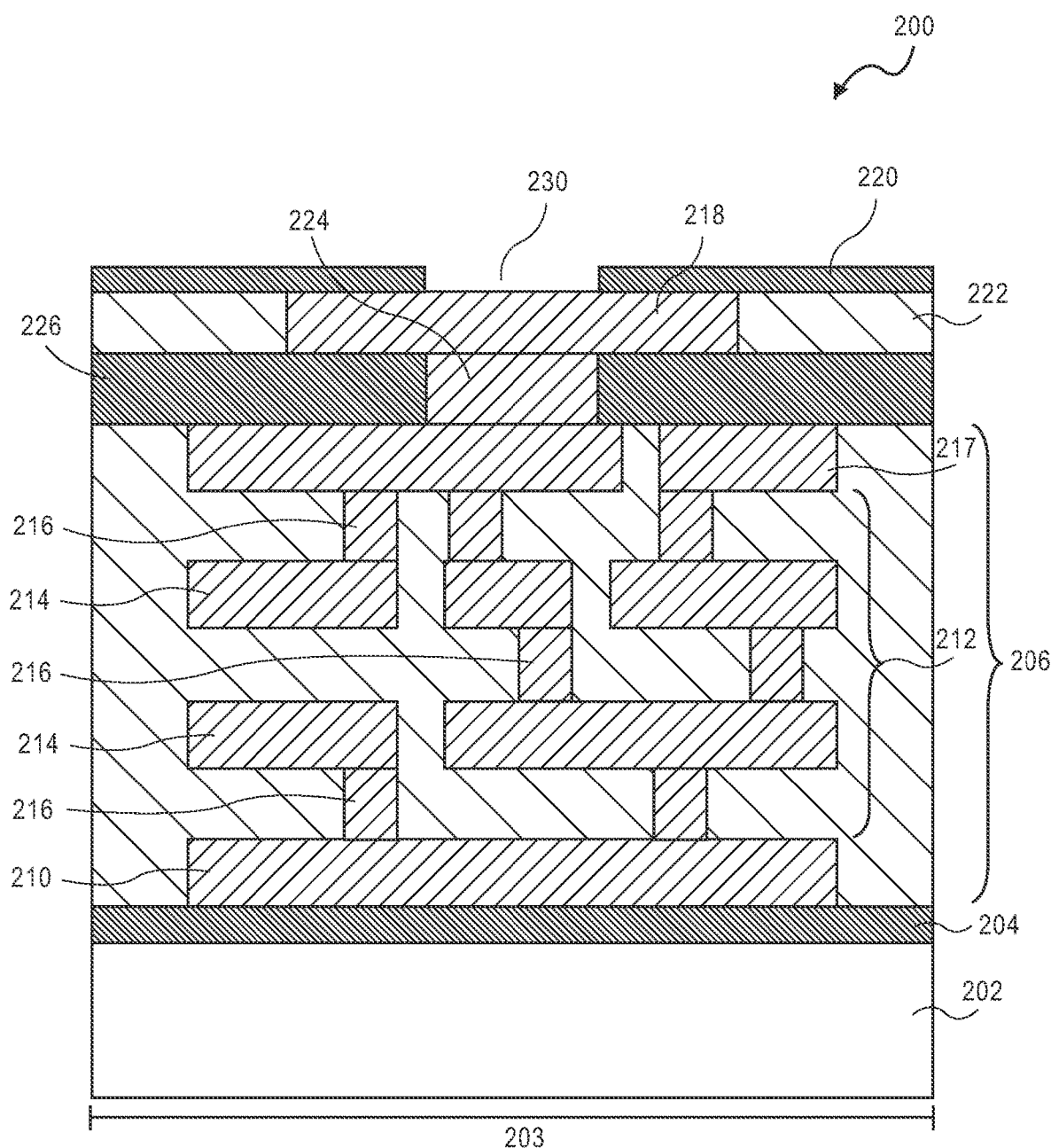
FIG. 2 is a cross-sectional view of a silicon bridge having a relatively thin conductive pad structure, in accordance with an embodiment of the present invention.

Referring to FIG. 2, a semiconductor structure 200 (such as a silicon bridge) includes a substrate 202 having a lower insulating layer 204 disposed thereon. The substrate has a perimeter 203. A metallization structure 206 is disposed on the lower insulating layer 204. The metallization structure includes conductive routing 210/212/214/216/217 disposed in a dielectric material stack. A conductive pad 218 is disposed in a plane above the metallization structure 206.

It is to be appreciated that a silicon bridge structure includes numerous conductive pads 218 in the plane above the metallization structure 206, however, one pad is shown for simplicity. As will be applicable to embodiments described below, in one embodiment, the structure 200 includes first and second pluralities of conductive pads 218 in the plane above the metallization structure 206. In one such embodiment, conductive routing of the metallization structure 206 electrically connects the first plurality of conductive pads with the second plurality of conductive pads.

Referring again to FIG. 2, an upper insulating layer 220 is disposed on the conductive pad 218, e.g., on first and second pluralities of conductive pads 218. In an embodiment, the upper insulating layer 220 has a perimeter substantially the same as the perimeter 203 of the substrate 202. In one such embodiment, the presence of an upper insulating layer 220 having a perimeter substantially the same as the perimeter 203 of the substrate 202 is indicative of a layer that is formed at the wafer level and is singulated with the silicon bridge die, as opposed to being included as a larger substrate package layer.

In an embodiment, the upper insulating layer 220 is a layer of silicon nitride. In one embodiment, the layer of silicon nitride is a layer selected from the group consisting of a silicon rich silicon nitride layer, a silicon poor silicon nitride layer, and a stoichiometric silicon nitride layer ($Si_3N_4$). In one embodiment, the layer of silicon nitride has a thickness approximately in the range of 75-150 nanometers.

In an embodiment, the conductive pad 218 (and hence the first and second pluralities of conductive pads) has a thickness of approximately 2 microns. In one embodiment, the conductive pad 218 (and hence the first and second pluralities of conductive pads) include copper. In one embodiment, the upper insulating layer 220 has a plurality of holes (such as hole 230) disposed therein. The plurality of holes exposes conductive pads 218 of the first and second pluralities of conductive pads. It is to be appreciated that, in one embodiment, the plurality of holes 230 is formed during a silicon bridge embedding process by using a laser drilling process during the time that the package via is fabricated.

In an embodiment, the metallization structure 206 includes a bottommost metal line layer 210 disposed on the lower insulating layer 204. Intermediate layers 212 of alternating metal line layers 214 and via layers 216 are disposed on the bottommost metal line layer 210. An uppermost metal line layer 217 is disposed on the intermediate layers 212 of alternating metal line layers 214 and via layers 216.

In an embodiment, the conductive pad 218 (and hence the first and second pluralities of conductive pads) is disposed on a layer including terminal via structures (one terminal via structure shown as 224) disposed in an intermediate insulating layer 226. The terminal via structure 224 couples the conductive pad 218 to the uppermost metal line layer 217 of the metallization structure 206. In one embodiment, the conductive pad 218 (and hence the first and second pluralities of conductive pads) is disposed in a layer of silicon oxide 222.

In an embodiment, the semiconductor structure 200 is a silicon bridge. In one such embodiment, substrate 202 is fabricated from single crystalline silicon. In a particular embodiment, the substrate 200 is free from having semiconductor devices disposed therein. That is, the primary function of the silicon bridge die is to provide local and direct communication between two dies coupled to the silicon bridge die.

In an embodiment, the upper insulating layer 220 is used as a stable protection layer to provide hermetic protection to a copper pad metal layer. In an embodiment, the upper insulating layer 220 provides protection for the copper pad against forming oxidation or other contaminated surface. In an embodiment, implementation of the upper insulating layer 220 is implemented to reduce silicon bridge fab processing throughput time and/or improve wafer thinning yield by reducing wafer bowing.

Figure 3:
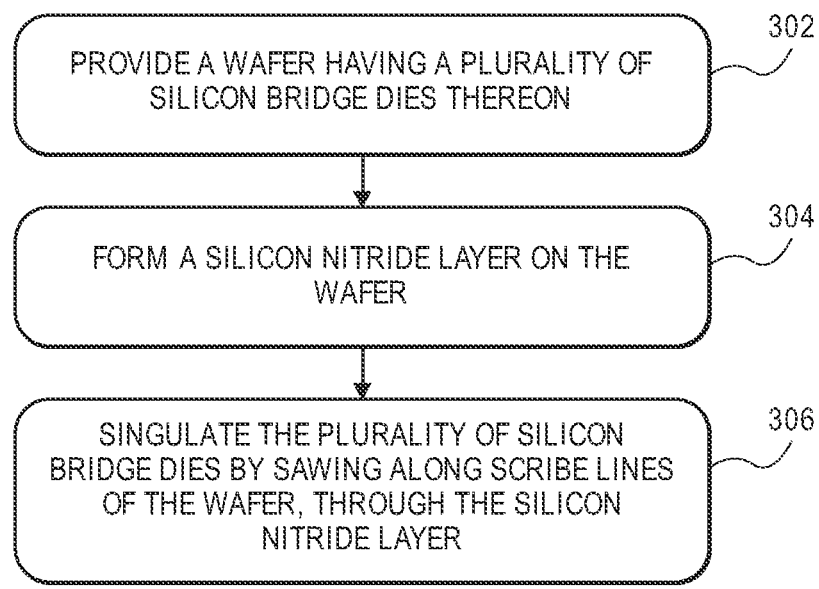
FIG. 3 is a flowchart illustrating operations in a method of fabricating a silicon bridge structure having a relatively thin conductive pad structure, in accordance with an embodiment of the present invention.

In another aspect, a relatively thin conductive pad for a silicon bridge is fabricated as thin, as opposed to fabricated as thick and subsequently reduced to a thin conductive pad. In an exemplary fabrication scheme, FIG. 3 is a flowchart 300 illustrating operations in a method of fabricating a silicon bridge structure having a relatively thin conductive pad structure, in accordance with an embodiment of the present invention.

Referring to operation 302 of flowchart 300, a method of fabricating a plurality of silicon bridge dies includes providing a wafer having a plurality of silicon bridge dies thereon. Each of the plurality of silicon bridge dies has an uppermost layer of copper pads exposed and having a thickness of approximately 2 microns. In one embodiment, the uppermost layer of copper pads is initially formed at the thickness of approximately 2 microns.

Referring to operation 304 of flowchart 300, the method of fabricating a plurality of silicon bridge dies also includes forming a silicon nitride layer on the wafer and covering the uppermost layer of copper pads of the plurality of silicon bridge dies. In one embodiment, the silicon nitride layer has a thickness approximately in the range of 75-150 nanometers. In one embodiment, the uppermost layer of copper pads is formed at the thickness of approximately 2 microns, and forming the silicon nitride layer on the wafer involves forming the silicon nitride layer without substantially thinning the uppermost layer of copper pads prior to the forming the silicon nitride layer. In one embodiment, forming the silicon nitride layer involves forming a layer selected from the group consisting of a silicon rich silicon nitride layer, a silicon poor silicon nitride layer, and a stoichiometric silicon nitride layer ($Si_3N_4$). In one embodiment, the silicon nitride layer is formed on the uppermost layer of copper pads and on a layer of silicon oxide in which the uppermost layer of copper pads is formed.

Referring to operation 306 of flowchart 300, the method of fabricating a plurality of silicon bridge dies also includes singulating the plurality of silicon bridge dies by sawing along scribe lines of the wafer, through the silicon nitride layer. In one embodiment, subsequent to singulating the plurality of silicon bridge dies, a plurality of holes is formed in the silicon nitride layer. The plurality of holes exposes copper pads of the uppermost layer of copper pads. The individual dies may then be suitable for inclusion or embedding in a package substrate. It is to be appreciated that, in one embodiment, the plurality of holes is formed during a silicon bridge embedding process by using a laser drilling process during the time that the package via is fabricated.

The arrangement of an upper thin conductive pad and covering insulating layer may extend over regions of a silicon bridge die differing from the regions exemplified in FIG. 2, such as regions a vertically aligned arrangement of conductive lines and vias. As an example, FIG. 4 illustrates another cross-sectional view of a silicon bridge having a relatively thin conductive pad structure, in accordance with an embodiment of the present invention.

Figure 4:
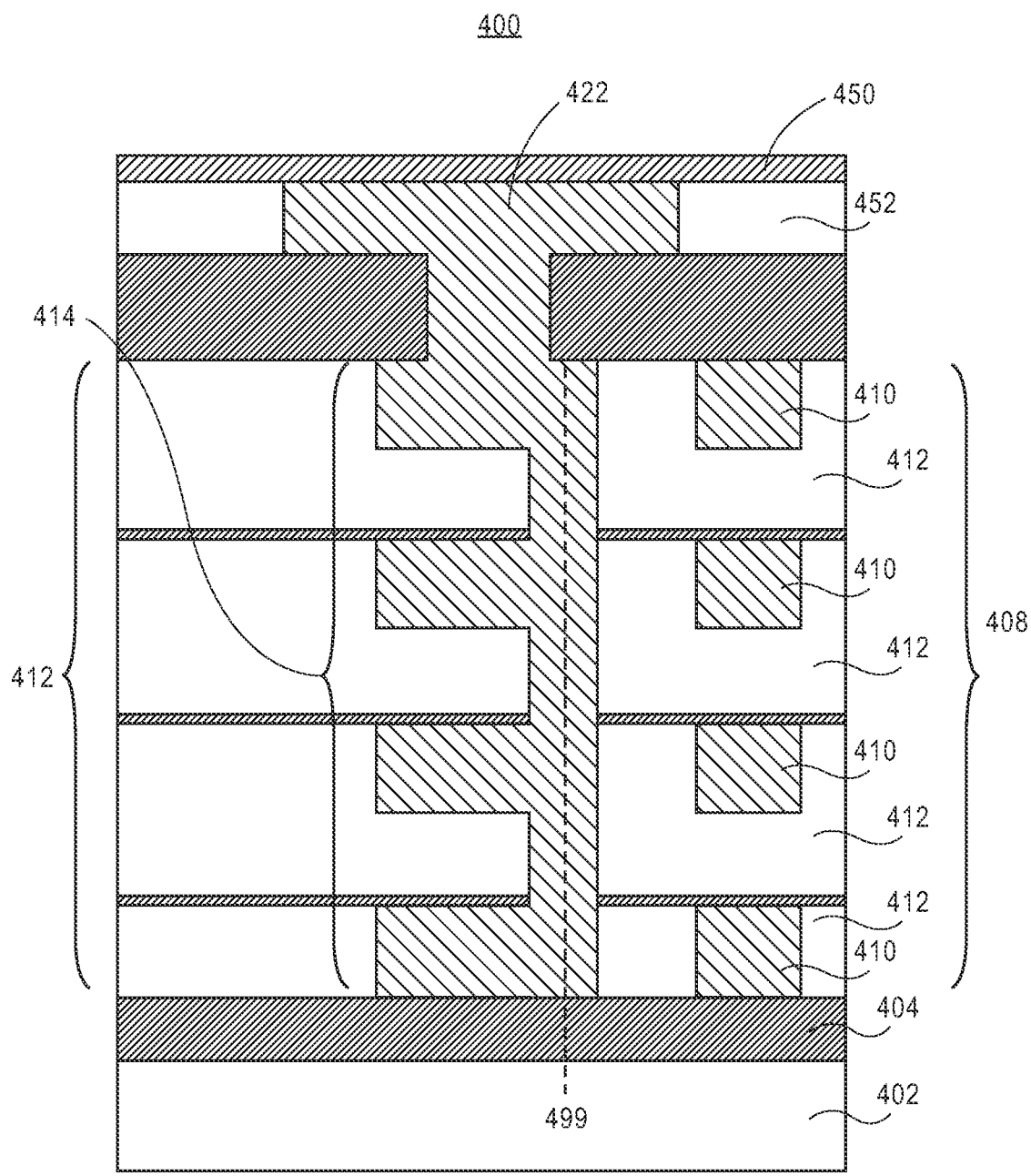
FIG. 4 illustrates another cross-sectional view of a silicon bridge having a relatively thin conductive pad structure, in accordance with an embodiment of the present invention.

Referring to FIG. 4, in an embodiment, a semiconductor structure 400 (such as a silicon bridge) includes a substrate 402 having an insulating layer 404 disposed thereon. A metallization structure 408 is disposed on the insulating layer 404. The metallization structure 408 includes conductive routing 410 disposed in a dielectric material stack 412. A conductive structure 498 including a vertically dense arrangement 414 of lines and vias is included in the metallization structure. The vertically dense arrangement 414 of lines and vias is aligned along a common axis 499. In one embodiment, an uppermost layer of the metallization structure includes first and second pluralities of conductive pads thereon, such as pad 422 shown in FIG. 4. In one such embodiment, the conductive pad 422 includes a layer of copper having a thickness of approximately 2 microns and is situated in a layer of silicon oxide 452. In an embodiment, a layer of silicon nitride 450 is formed on the conductive pad 422 and on the layer of silicon oxide 452 as a protecting layer.

In another aspect, Embedded Multi-die Interconnect Bridge (EMIB) technology is being used and/or evaluated for applications such as the combination of high performance computing (HPC) with high bandwidth memory (HBM). Providing a high level overview of the concepts described herein, FIG. 5A illustrates a cross-sectional view of a semiconductor package having an Embedded Multi-die Interconnect Bridge (EMIB) with a relatively thin conductive pad structure connecting two dies, in accordance with an embodiment of the present invention.

Figure 5A:
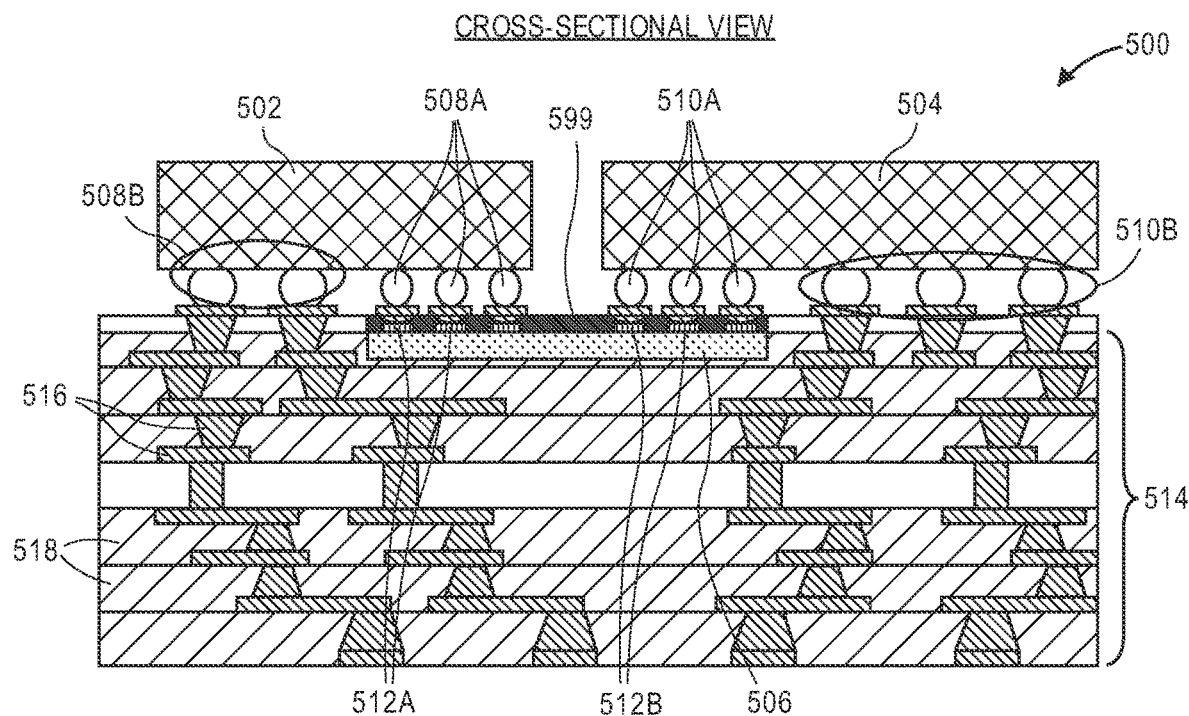
FIG. 5A illustrates a cross-sectional view of a semiconductor package having an Embedded Multi-die Interconnect Bridge (EMIB) with a relatively thin conductive pad structure connecting multiple dies, in accordance with an embodiment of the present invention.

Referring to FIG. 5A, a semiconductor package 500 includes a first die 502 (e.g., a memory die) and a second die 504 (e.g., a logic, CPU or SoC die). The first die 502 and second die 504 are coupled to a silicon bridge 506 through bumps 508A and 510A of the first die 502 and second die 504, respectively, and bond pads 512A and 512B (also referred to as conductive pads 512A and 512B) of the silicon bridge 506, e.g., by thermal compression bonding (TCB).

In an embodiment, the silicon bridge 506 includes an upper insulating layer 599 disposed on the first and second pluralities of conductive pads 512A and 512B. In one embodiment, as described above, the upper insulating layer 599 has a perimeter substantially the same as the perimeter of the substrate 506. In one embodiment, the upper insulating layer 599 of the silicon bridge 506 has a plurality of holes disposed therein. The plurality of holes exposes the conductive pads of the first and second pluralities of conductive pads 512A and 512B. In a specific embodiment, the upper insulating layer 599 of the silicon bridge 506 is a layer of silicon nitride selected from the group consisting of a silicon rich silicon nitride layer, a silicon poor silicon nitride layer, and a stoichiometric silicon nitride layer ($Si_3N_4$). In a particular embodiment, the layer of silicon nitride has a thickness approximately in the range of 75-150 nanometers.

Figure 5B:
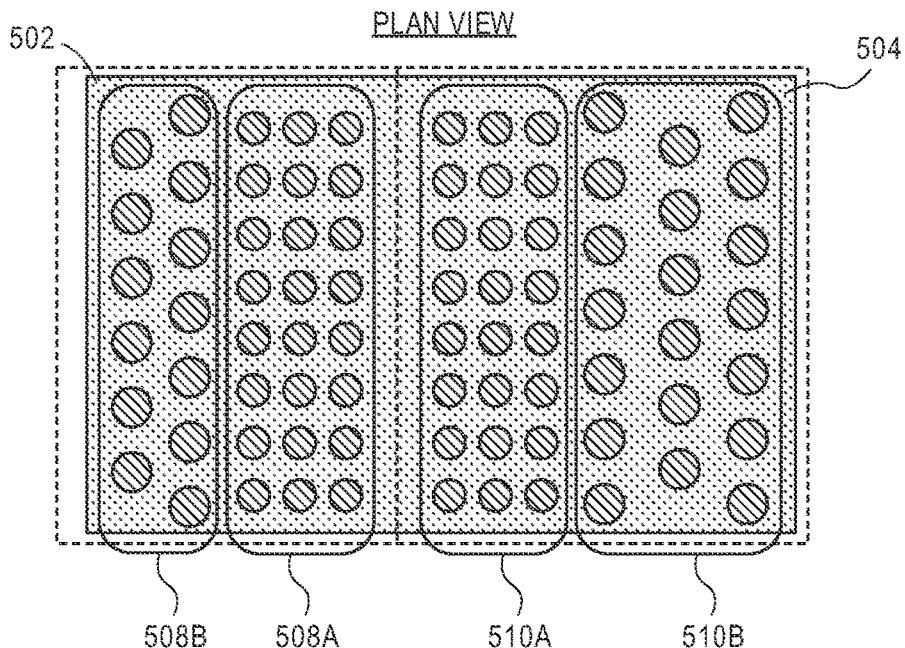
FIG. 5B illustrates a plan view showing the bump arrays of the first and second dies of FIG. 5A, in accordance with an embodiment of the present invention.

Referring again to FIG. 5A, the first die 102 and second die 104 are disposed on a package substrate 514. The package substrate 514 includes metallization layers 516 (e.g., a vertical arrangement of lines and vias) formed in insulating layers 518. The metallization layers 516 layers may be simple or complex and may be for coupling to other packages or may form part or all of an organic package or printed circuit board (PCB), etc. The first die 502 and second die 504 may each be coupled directly to the package substrate 514 through bumps 508B and 510B, respectively, as is depicted in FIG. 5A. FIG. 5B illustrates a plan view showing the bump arrays 508A, 508B, 510A and 510B of the first 502 and second 504 dies of FIG. 5A.

Referring again to FIG. 5A, the silicon bridge 506 as depicted is referred to as an Embedded Multi-die Interconnect Bridge (EMIB) since it is included with the layers of the package substrate 514. In another embodiment, such a silicon bridge 506 is not embedded in the package, but rather in an open cavity of a substrate or board. In either case, in an embodiment, and as will be described in greater detail below, the silicon bridge 506 is free from having semiconductor devices disposed therein (i.e., the silicon bridge 506 provides routing layers only, and not active semiconductor devices).

Referring again to FIG. 5A, the first 502 and second 504 adjacent semiconductor dies are disposed on the semiconductor package substrate 514 and electrically coupled to one another by the conductive routing of the metallization structure of the silicon bridge 506. In one embodiment, the first semiconductor die 502 is a memory die, and the second semiconductor die 504 is a logic die. The first semiconductor die 502 is attached to the first plurality of conductive pads 512A of the silicon bridge 506 through the plurality of holes disposed in the upper insulating layer 599 of the silicon bridge 506. The second semiconductor die 504 is attached to the second plurality of conductive pads 512B of the silicon bridge 506 through the plurality of holes disposed in the upper insulating layer 599 of the silicon bridge 506. In one embodiment, the conductive routing of the silicon bridge 506 electrically couples the first plurality of conductive pads 512A with the second plurality of conductive pads 512B. In one embodiment, the first 512A and second 512B pluralities of conductive pads of the silicon bridge 506 include a layer of copper having a thickness of approximately 2 microns.

Although the above describe embodiments are directed to two individual dies coupled to one another by a silicon bridge or EMIB, it is to be appreciated that complex structure may also benefit from embodiments described herein. In a first example, FIG. 6 illustrates a cross-sectional view of a semiconductor package including multiple die coupled with an embedded multi-die interconnect bridge (EMIB) based on a silicon bridge having a relatively thin conductive pad structure, in accordance with an embodiment of the present invention.

Figure 6:
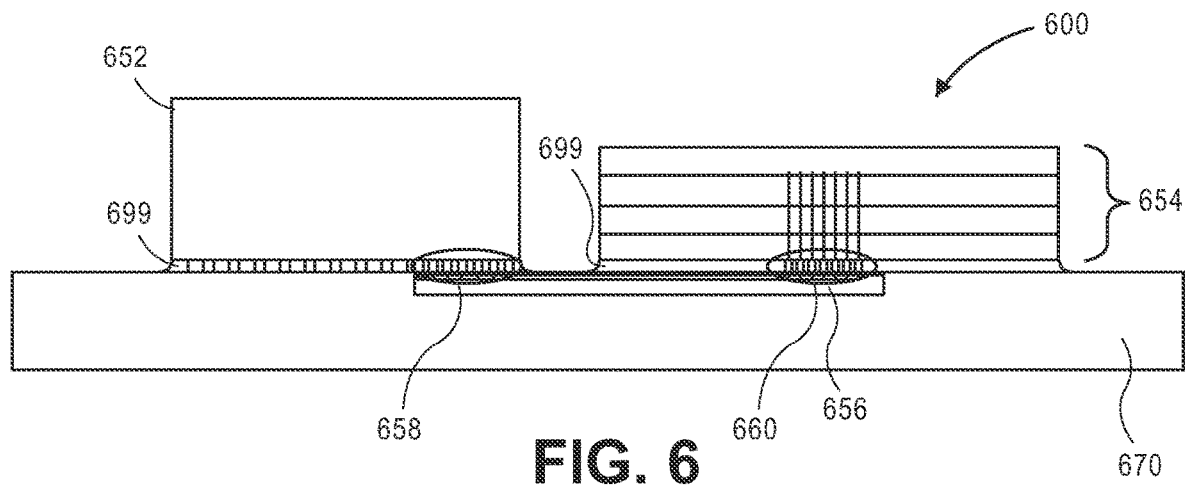
FIG. 6 illustrates a cross-sectional view of a semiconductor package including multiple die coupled with an embedded multi-die interconnect bridge (EMIB) based on a silicon bridge having a relatively thin conductive pad structure, in accordance with an embodiment of the present invention.

Referring to FIG. 6, the semiconductor package 600 includes a first die 652 (such as a logic die central processing unit, CPU) and a memory die stack 654. The first die 652 and the memory die stack 654 are coupled to an EMIB 656 through bumps 658 and 660 of the first die 652 and the memory die stack 654, respectively, e.g., by thermal compression bonding (TCB). In accordance with an embodiment of the present invention, the bumps 658 and 660 of the first die 652 and the memory die stack 654 are coupled to conductive pads of the EMIB 656 through an insulating layer (e.g., a silicon nitride layer) of the EMIB 656. The EMIR 656 is embedded in a substrate (e.g., a flexible organic substrate) or board (such as an epoxy PCB material) material 670. An underfill material 699 may be included between the first die 652 and the EMIR 656/substrate 670 interface and between the memory die stack 654 and the EMIR 656/substrate 670 interface, as is depicted in FIG. 6.

Figure 7:
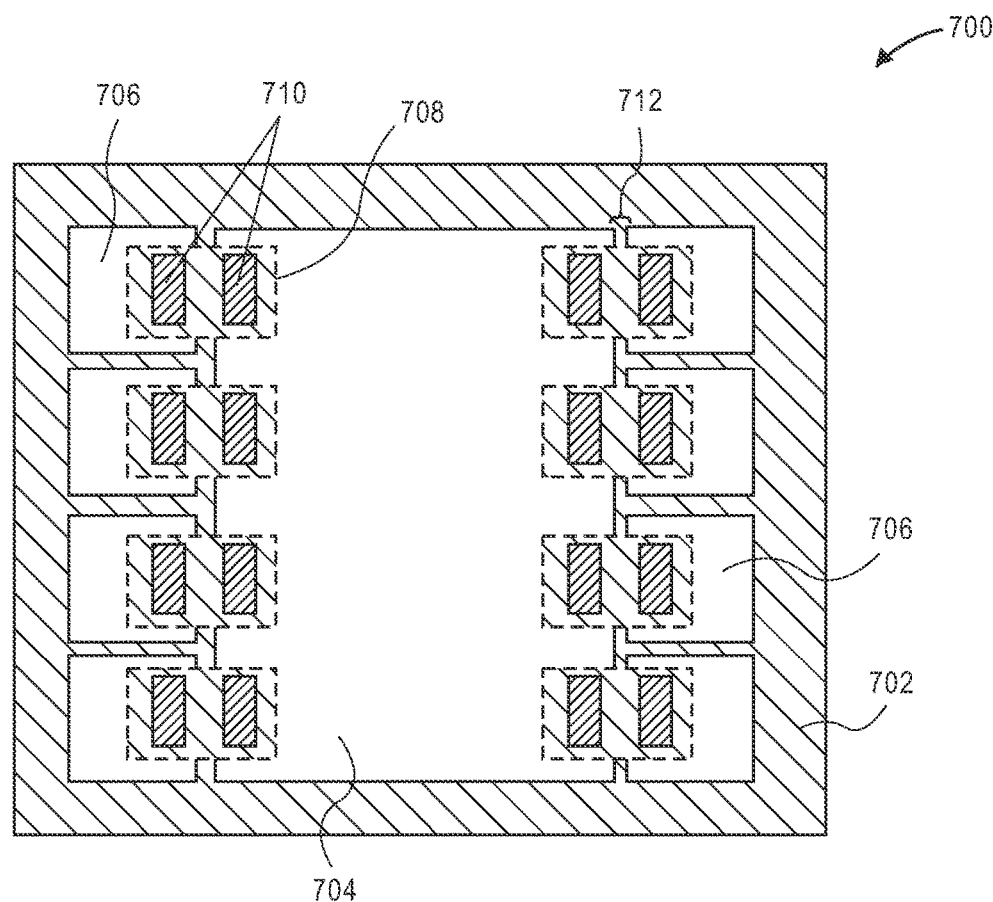
FIG. 7 illustrates a plan view of a package layout for co-packaged high performance computing (HPC) die and high bandwidth memory (HBM) layout based on silicon bridges having a relatively thin conductive pad structure, in accordance with an embodiment of the present invention.

In a second example, FIG. 7 illustrates a plan view of a package layout for co-packaged high performance computing (HPC) die and high bandwidth memory (HBM) layout based on silicon bridges having a relatively thin conductive pad structure, in accordance with an embodiment of the present invention.

Referring to FIG. 7, a package layout 700 includes a common substrate 702. A central processing unit or system-on-chip (CPU/SoC) die 704 is supported by the substrate 702 along with eight memory dies 706. A plurality of EMIBs 708 bridge the memory dies 706 to the CPU/SoC die 704 by C4 connections 710. In accordance with an embodiment of the present invention, the C4 connections 710 are formed through an insulating layer (e.g., a silicon nitride layer) of the EMIBs 708. The die-to-die spacing 712 is approximately 100-200 microns. It is to be appreciated that, from a top-down view perspective, the dies 704 and 706 are disposed above the C4 connections 710, which are disposed above the EMIBs 708, which are included in the substrate 702.

As described above, in an embodiment, a substrate for a silicon bridge may be a single crystalline silicon substrate. In other embodiments, and still in the context of a "silicon bridge," the substrate may be composed of a multi- or single-crystal of a material which may include, but is not limited to, germanium, silicon-germanium or a Group III-V compound semiconductor material. In another embodiment, a glass substrate is used.

Referencing the above description regarding silicon bridge technology, in an embodiment, an insulating, dielectric or interlayer dielectric (ILD) material is one such as, but not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The insulating, dielectric or interlayer dielectric (ILD) material may be formed by conventional techniques, such as, for example, chemical vapor deposition (CVD), physical vapor deposition (PVD), or by other deposition methods.

Referencing the above description regarding silicon bridge technology, in an embodiment, interconnect or conductive routing material is composed of one or more metal or other conductive structures. A common example is the use of copper lines and structures (such as vias) that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines or conductive routing are also sometimes referred to in the arts as traces, wires, lines, metal, or simply interconnects.

Figure 8:
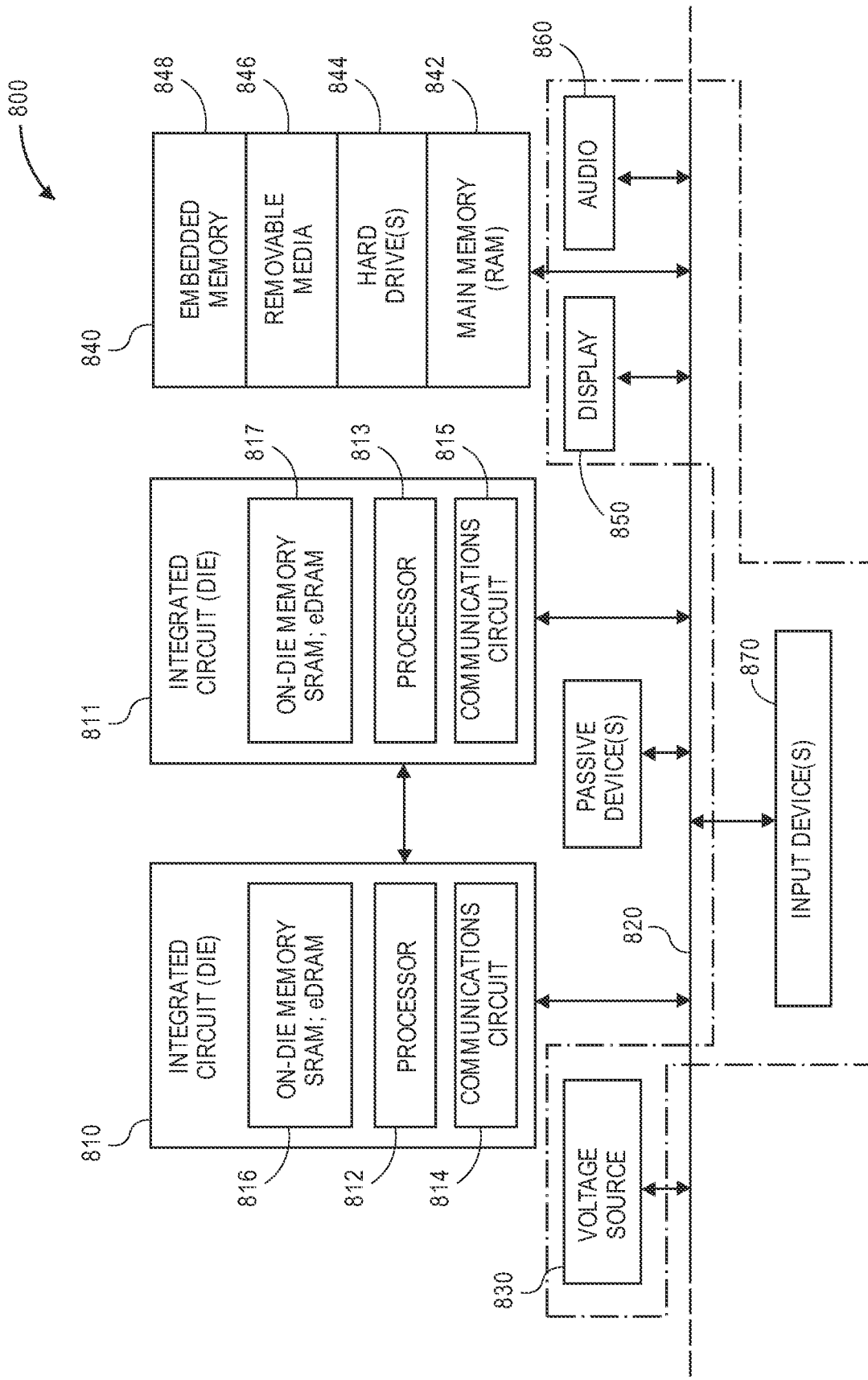
FIG. 8 is a schematic of a computer system, in accordance with an embodiment of the present invention.

FIG. 8 is a schematic of a computer system 800, in accordance with an embodiment of the present invention. The computer system 800 (also referred to as the electronic system 800) as depicted can embody a silicon bridge having an alternative surface for the conductive pad layer of the silicon bridge, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a silicon bridge having an alternative surface for the conductive pad layer of the silicon bridge, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having a silicon bridge having an alternative surface for the conductive pad layer of the silicon bridge, according to any of the several disclosed embodiments and their equivalents, an electronic system, a computer system, one or more methods of fabricating an integrated circuit, and one or more methods of fabricating an electronic assembly that includes a package substrate having a silicon bridge having an alternative surface for the conductive pad layer of the silicon bridge, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a silicon bridge having an alternative surface for the conductive pad layer of the silicon bridge embodiments and their equivalents. A foundation substrate may be included, as represented by the dashed line of FIG. 8. Passive devices may also be included, as is also depicted in FIG. 8.

Embodiments of the present invention include alternative surfaces for conductive pad layers of silicon bridges for semiconductor packages and the resulting silicon bridges and semiconductor packages.

In an embodiment, a semiconductor structure includes a substrate having a lower insulating layer disposed thereon. The substrate has a perimeter. A metallization structure is disposed on the lower insulating layer. The metallization structure includes conductive routing disposed in a dielectric material stack. First and second pluralities of conductive pads are disposed in a plane above the metallization structure. Conductive routing of the metallization structure electrically connects the first plurality of conductive pads with the second plurality of conductive pads. An upper insulating layer is disposed on the first and second pluralities of conductive pads. The upper insulating layer has a perimeter substantially the same as the perimeter of the substrate.

In one embodiment, the upper insulating layer is a layer of silicon nitride.

In one embodiment, the layer of silicon nitride is a layer selected from the group consisting of a silicon rich silicon nitride layer, a silicon poor silicon nitride layer, and a stoichiometric silicon nitride layer ($Si_3N_4$).

In one embodiment, the layer of silicon nitride has a thickness approximately in the range of 75-150 nanometers.

In one embodiment, the first and second pluralities of conductive pads have a thickness of approximately 2 microns.

In one embodiment, the first and second pluralities of conductive pads include copper.

In one embodiment, the upper insulating layer has a plurality of holes disposed therein. The plurality of holes exposes conductive pads of the first and second pluralities of conductive pads.

In one embodiment, the metallization structure includes a bottommost metal line layer disposed on the lower insulating layer, intermediate layers of alternating metal line layers and via layers disposed on the bottommost metal line layer, and an uppermost metal line layer disposed on the intermediate layers of alternating metal line layers and via layers.

In one embodiment, the first and second pluralities of conductive pads are disposed on a layer including terminal via structures disposed in an intermediate insulating layer. The terminal via structures couple the first and second pluralities of conductive pads to the uppermost metal line layer of the metallization structure.

In one embodiment, the first and second pluralities of conductive pads are disposed in a layer of silicon oxide.

In one embodiment, the semiconductor structure is a silicon bridge.

In one embodiment, the substrate is free from having semiconductor devices disposed therein.

In an embodiment, a method of fabricating a plurality of silicon bridge dies includes providing a wafer having a plurality of silicon bridge dies thereon. Each of the plurality of silicon bridge dies has an uppermost layer of copper pads exposed and having a thickness of approximately 2 microns. The method also includes forming a silicon nitride layer on the wafer and covering the uppermost layer of copper pads of the plurality of silicon bridge dies. The silicon nitride layer has a thickness approximately in the range of 75-150 nanometers. The method also includes singulating the plurality of silicon bridge dies by sawing along scribe lines of the wafer, through the silicon nitride layer.

In one embodiment, the uppermost layer of copper pads is formed at the thickness of approximately 2 microns, and forming the silicon nitride layer on the wafer involves forming the silicon nitride layer without substantially thinning the uppermost layer of copper pads prior to the forming the silicon nitride layer.

In one embodiment, forming the silicon nitride layer involves forming a layer selected from the group consisting of a silicon rich silicon nitride layer, a silicon poor silicon nitride layer, and a stoichiometric silicon nitride layer ($Si_3N_4$).

In one embodiment, the method further includes, subsequent to singulating the plurality of silicon bridge dies, forming a plurality of holes in the silicon nitride layer. The plurality of holes exposes copper pads of the uppermost layer of copper pads.

In one embodiment, forming the silicon nitride layer on the wafer involves forming the silicon nitride layer on the uppermost layer of copper pads and on a layer of silicon oxide in which the uppermost layer of copper pads is formed.

In an embodiment, a semiconductor package includes an embedded interconnection bridge (EMIB) including a silicon bridge disposed within a semiconductor package substrate. The silicon bridge includes a silicon substrate having a lower insulating layer disposed thereon, the silicon substrate having a perimeter. The silicon bridge also includes a metallization structure disposed on the lower insulating layer, the metallization structure including conductive routing disposed in a dielectric material stack. The silicon bridge also includes first and second pluralities of conductive pads disposed in a plane above the metallization structure. The conductive routing of the metallization structure electrically connects the first plurality of conductive pads with the second plurality of conductive pads. The silicon bridge also includes an upper insulating layer disposed on the first and second pluralities of conductive pads. The upper insulating layer has a perimeter substantially the same as the perimeter of the silicon substrate. The upper insulating layer of the silicon bridge has a plurality of holes disposed therein, the plurality of holes exposing conductive pads of the first and second pluralities of conductive pads. The semiconductor package also includes first and second adjacent semiconductor dies disposed on the semiconductor package substrate and directly electrically coupled to the first and second pluralities of conductive pads of the silicon bridge, respectively, through the plurality of holes disposed in the upper insulating layer. The first and second adjacent semiconductor dies are electrically coupled to one another by the conductive routing of the metallization structure of the silicon bridge.

In one embodiment, the first semiconductor die is a memory die, and the second semiconductor die is a logic die.

In one embodiment, the upper insulating layer of the silicon bridge is a layer of silicon nitride selected from the group consisting of a silicon rich silicon nitride layer, a silicon poor silicon nitride layer, and a stoichiometric silicon nitride layer ($Si_3N_4$), and the layer of silicon nitride has a thickness approximately in the range of 75-150 nanometers.

In one embodiment, the first and second pluralities of conductive pads of the silicon bridge have a thickness of approximately 2 microns, and the first and second pluralities of conductive pads include copper.

In one embodiment, the metallization structure of the silicon bridge includes a bottommost metal line layer disposed on the lower insulating layer, intermediate layers of alternating metal line layers and via layers disposed on the bottommost metal line layer, and an uppermost metal line layer disposed on the intermediate layers of alternating metal line layers and via layers.

In one embodiment, the first and second pluralities of conductive pads of the silicon bridge are disposed on a layer including terminal via structures disposed in an intermediate insulating layer, and the terminal via structures couple the first and second pluralities of conductive pads to the uppermost metal line layer of the metallization structure of the silicon bridge.

In one embodiment, the first and second pluralities of conductive pads of the silicon bridge are disposed in a layer of silicon oxide of the silicon bridge.

In one embodiment, the silicon substrate of the silicon bridge is free from having semiconductor devices disposed therein.

What is claimed is:

1. A method of fabricating a plurality of silicon bridge dies, the method comprising:
   providing a wafer having a plurality of silicon bridge dies thereon, each of the plurality of silicon bridge dies having an uppermost layer of copper pads exposed;
   forming a silicon nitride layer on the wafer, the silicon nitride layer covering the uppermost layer of copper pads of the plurality of silicon bridge dies; and
   singulating the plurality of silicon bridge dies by sawing along scribe lines of the wafer, through the silicon nitride layer.

2. The method of claim 1, wherein forming the silicon nitride layer on the wafer comprises forming the silicon nitride layer without substantially thinning the uppermost layer of copper pads prior to the forming the silicon nitride layer.

3. The method of claim 1, wherein forming the silicon nitride layer comprises forming a layer selected from the group consisting of a silicon rich silicon nitride layer, a silicon poor silicon nitride layer, and a stoichiometric silicon nitride layer ($Si_3N_4$).

4. The method of claim 1, further comprising:
subsequent to singulating the plurality of silicon bridge dies, forming a plurality of holes in the silicon nitride layer, the plurality of holes exposing copper pads of the uppermost layer of copper pads.

5. The method of claim 1, wherein forming the silicon nitride layer on the wafer comprises forming the silicon nitride layer on the uppermost layer of copper pads and on a layer of silicon oxide in which the uppermost layer of copper pads is formed.

6. A method of fabricating a semiconductor structure, the method comprising:
providing a substrate having a lower insulating layer disposed thereon, the substrate having a perimeter, the perimeter having a first side and a second side laterally opposite the first side from a cross-sectional perspective;
forming a metallization structure disposed on the lower insulating layer, the metallization structure comprising conductive routing disposed in a dielectric material stack;
forming a conductive pad disposed in a plane above the metallization structure, the conductive pad electrically coupled to the conductive routing of the metallization structure;
forming a conductive structure laterally adjacent to the metallization structure and the conductive pad, the conductive structure comprising a vertically dense arrangement of lines and vias aligned along a common axis; and
forming an upper insulating layer disposed on the conductive pad, the upper insulating layer having a perimeter substantially the same as the perimeter of the substrate, the upper insulating layer having a hole exposing only a portion of the conductive pad, and the upper insulating layer entirely covering the conductive structure, wherein an entirety of the upper insulating layer has a uniform thickness and is planar, and wherein the upper insulating layer is entirely within the first side and the second side of the perimeter from the cross-sectional perspective.

7. The method of claim 6, wherein the upper insulating layer is a layer of silicon nitride.

8. The method of claim 7, wherein the layer of silicon nitride is a layer selected from the group consisting of a silicon rich silicon nitride layer, a silicon poor silicon nitride layer, and a stoichiometric silicon nitride layer ($Si_3N_4$).

9. The method of claim 7, wherein the layer of silicon nitride has a thickness approximately in the range of 75-150 nanometers.

10. The method of claim 6, wherein the conductive pad has a thickness of approximately 2 microns.

11. The method of claim 6, wherein the conductive pad comprises copper.

12. The method of claim 6, wherein the metallization structure comprises a bottommost metal line layer disposed on the lower insulating layer, intermediate layers of alternating metal line layers and via layers disposed on the bottommost metal line layer, and an uppermost metal line layer disposed on the intermediate layers of alternating metal line layers and via layers.

13. The method of claim 12, wherein the conductive pad is disposed on a layer comprising a terminal via structure disposed in a second intermediate insulating layer, and wherein the terminal via structure couples the conductive pad to the uppermost metal line layer of the metallization structure.

14. The method of claim 6, wherein the conductive pad is disposed in a layer of silicon oxide.

15. The method of claim 6, wherein the semiconductor structure is a silicon bridge.

16. The method of claim 6, wherein the substrate is free from having semiconductor devices disposed therein.

* * * * *